United States Patent [19]

Oppelt et al.

[11] Patent Number: 5,609,154
[45] Date of Patent: Mar. 11, 1997

[54] DUPLEXER INCLUDING A VARIABLE CAPACITANCE DIODE FOR AN ULTRASOUND IMAGING SYSTEM

[75] Inventors: Ralph Oppelt, Uttenreuth; Markus Vester, Erlangen, both of Germany

[73] Assignee: Siemens Aktiengesellschaft, München, Germany

[21] Appl. No.: 425,631

[22] Filed: Apr. 20, 1995

[30] Foreign Application Priority Data

May 19, 1994 [DE] Germany .......................... 44 17 605.8

[51] Int. Cl.⁶ ............................................. A61B 8/00
[52] U.S. Cl. ............................................. 128/661.01
[58] Field of Search ................. 628/660.01, 660.07, 628/661.01; 73/625–626

[56] References Cited

U.S. PATENT DOCUMENTS 3,705,363 12/1972 Okada et al. ...................... 331/174
4,047,112  9/1977 Sakamoto ........................... 325/455
5,027,821  7/1991 Hirama et al. .................. 128/661.01
5,318,034  6/1994 Ishida et al. ................... 128/661.01
5,394,750  3/1995 Matzuk ................................ 73/629

Primary Examiner—Francis Jaworski
Attorney, Agent, or Firm—Kenyon & Kenyon

[57] ABSTRACT

A duplexer for an ultrasound imaging-system capable of selectively coupling a transducer element to either a transmitter or a receiver, depending on whether the imaging system is in the transmit mode or receive mode, contains a variable capacitance diode which is connected in a direction opposite that of transmit pulses emitted by the transmitter between the transducer element and the receiver. In this manner, one obtains an improved duplexer that operates with virtually no power loss, without drive circuits, without leakage currents, and with low noise.

12 Claims, 1 Drawing Sheet

DUPLEXER INCLUDING A VARIABLE CAPACITANCE DIODE FOR AN ULTRASOUND IMAGING SYSTEM

BACKGROUND OF THE INVENTION

The present invention relates generally to a duplexer for an ultrasound imaging system, and in particular to a duplexer for selectively connecting an ultrasound transducer element to either a transmitter or a receiver. A duplexer of this general type is disclosed, for example, in German publication DE-A-33 01 967.

The present invention is related to an invention described in an application entitled "Duplexer Including a Field-Effect Transistor for Use in an Ultrasound Imaging System," filed concurrently with the present application by the same inventors. The disclosure of the copending application is explicitly incorporated herein by reference.

Ultrasound imaging systems generally operate according to a "pulse-echo method." Such systems are capable of alternately functioning in two basic modes: transmit and receive. In the transmit mode, one or more piezoelectric transducer elements, preferably arranged in a linear or two-dimensional array, are excited to high-frequency oscillation by electrical pulses emitted by a transmitter, thereby generating an ultrasound pulse that may be directed at an object to be imaged. This ultrasound pulse is echoed back towards the transducer from some point within the object; for example, at boundary layers between two media with differing acoustic impedance. Then, in the receive mode, the "echo pulse" is received by the transducer element and converted into a corresponding electrical input signal (i.e., the "echo signal") that is fed to a receiver equipped with sensitive preamplifiers for enhancing the signal. The amplified signal may then be fed to a signal processor for evaluating the echoed image data to generate a visual image.

The transmit pulse and the echo pulse must be separated from one another for the two operating modes of the ultrasound imaging system to operate effectively. To this end, a transmit/receive filter, known as a duplexer, is associated with each transducer element in the ultrasound imaging system. Each duplexer selectively connects a respective transducer element to either the transmitter or the receiver, depending on whether the transducer element is operating in the transmit mode or the receive mode.

Decoupling the transmitter from the receiver is principally desirable because of the differing amplitudes of the transmitted and received signals. For instance, the transmit pulses used to excite the transducer elements have comparably high voltage amplitudes, typically greater than 100 V. On the other hand, the received echo signals are comparatively weak, requiring amplification by sensitive preamplifiers in the receiver. The duplexer must therefore electrically decouple the receiver from the transmitter during the transmit mode to protect the preamplifiers from being damaged by the strong transmit pulses coming from the transmitter. Decoupling the receiver from the transmitter is also desirable during the receive mode to prevent noise generated by the transmitter from disrupting the signals input to the receiver. Similarly, decoupling the transmitter from the receiver is desirable during the transmit mode to prevent the receiver from reacting to the transmitter in a manner that might disrupt or distort the shape of the transmit pulse.

In addition to these fundamental operational requirements for a duplexer in an ultrasound imaging system, further conditions must often be met in practice. For example, small transducer elements, such as those typically found in linear or two-dimensional arrays, generally have a high internal impedance. The ohmic and, above all, the capacitive loading caused by the duplexer should therefore be kept as small as possible. Likewise, the internal current consumption of the duplexer should be minimized to limit power loss in the array. Finally, duplexers should be designed as small as possible to allow them to be easily integrated with the array.

Duplexers for ultrasound imaging systems can be designed to be active (i.e., controlled by a switching signal) or passive (i.e., functioning automatically).

Duplexers generally consist of two subcircuits. The first subcircuit couples the transducer element to the transmitter in the transmit mode, and decouples the transducer element from the transmitter in the receive mode. In addition, this first subcircuit decouples the transmitter from the receiver in the receive mode. Conversely, the second subcircuit couples the transducer element to the receiver in the receive mode, and decouples the transducer element from the receiver in the transmit mode. In addition, this second subcircuit decouples the receiver from the transmitter in the transmit mode. The two subcircuits and the transducer element are electrically connected to one another at a common connection point.

An inverse-parallel circuit consisting of two p-n diodes arranged with opposing polarity and connected respectively between the transducer element and the transmitter can serve as a suitable first subcircuit of a duplexer. In the transmit mode, only the pulse height of the transmit pulses is then reduced by the comparably low conducting-state voltage of the diodes (typically 0.7 V). In the receive mode, the two diodes represent only a small capacitive load, since the voltages occurring in the received echo signals are generally considerably smaller than the conducting-state voltage of the diodes. A circuit of this type is disclosed in U.S. Pat. No. 5,271,403.

A duplexer for an ultrasound imaging system having a linear ultrasound array of transducer elements and two specially-designed subcircuits having the above-described functions is disclosed in German publication DE-A-33 01 967. In that device, the first subcircuit (i.e., the "transmitter switch") consists of a p-n diode as a first switch, which is connected between the transducer element and the transmitter, and a second switch, which is connected in parallel to the transducer element between a connection point (situated between the first switch and the transducer element) and ground to provide better reverse attenuation. In the second subcircuit (i.e., the "receiver switch"), a circuit consisting of a resistor, a bidirectional transient absorption Zener diode for protecting the receiver input, and a receiver amplifier is connected between a switch manufactured using CMOS technology (which is controllable with a TTL logic level and exhibits high reverse attenuation) and the transducer element. The receiver switch is connected to the receiver input.

A significant failing of known duplexers, such as the ones just described, is the existence of relatively high leakage capacitances toward ground and toward the control lines. Moreover, increased loading of the transducer elements, exhibited as signal sources, is often associated with these leakage capacitances.

SUMMARY OF THE INVENTION

The present invention provides a duplexer for an ultrasound imaging system having the required functionality described above, but without the failings of prior art duplexers. According to the present invention, the duplexer includes a first switch for electrically coupling an ultrasound transducer element to a receiver during a receive mode, and for electrically decoupling both the transducer element and a transmitter from the receiver during a transmit mode, and a second switch for electrically coupling the transducer element to the transmitter during the transmit mode, and for electrically decoupling both the transducer element and the receiver from the transmitter during the receive mode.

Both the first and second switches are connected to the transducer element at a common connection point. The first switch, used for electrically coupling the transducer element to the receiver during the receive mode, comprises at least one variable capacitance diode connected between the transducer element and the receiver in the reverse direction of the transmit pulses emitted by the transmitter during the transmit mode. Since, as a result, neither of the two connections of the variable capacitance diode is connected to ground, leakage capacitances going directly toward ground are largely avoided. Moreover, with the help of the variable capacitance diode, the electrical connection between the transducer element and the receiver can be switched with virtually no power loss. Thus, a duplexer according to the present invention eliminates the principal drawbacks of prior art duplexers.

Yet another advantage of the present invention is that the switch for electrically connecting the transducer element and the receiver during receive mode is designed to be passive; that is, without drive circuits. Thus, no control signal is required to switch between transmit and receive modes. Additionally, in the embodiment just described, the variable capacitance diode couples the echo pulses received by the transducer element in a purely capacitive manner, so that virtually no additional noise reaches the receiver. Moreover, variable capacitance diodes can be readily integrated with an array of transducer elements.

Other features and advantages of the present invention will be apparent to persons skilled in the art from the following description of the preferred embodiments.

DETAILED DESCRIPTION

Figure 1:
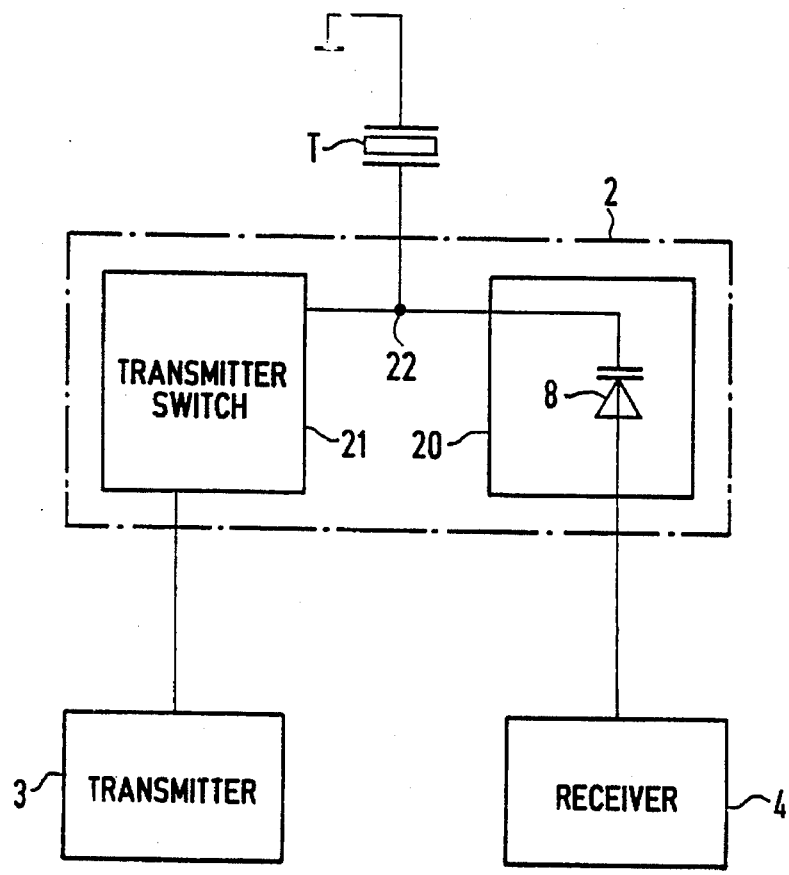
FIG. 1 shows an ultrasound imaging system including a duplexer with a variable capacitance diode, according to an embodiment of the present invention.

Referring now to FIG. 1, an ultrasound imaging system configured according to one embodiment of the present invention includes one or more ultrasound transducer elements T. The ultrasound imaging system is capable of selectively operating in two modes: transmit or receive. In the transmit mode, a transmitter 3 triggers the transducer element T with transmit pulses; while in the receive mode, a receiver 4 may be used to evaluate echo signals received by the transducer element T. A duplexer 2 facilitates switching between these two modes, electrically connecting the transducer element T to the transmitter 3 in the transmit mode, or to the receiver 4 in the receive mode.

Looking more closely at the transmit mode of operation, an object (not shown) to be imaged will be irradiated with ultrasonic pulses from the transducer element T. To accomplish this, the transmitter 3 emits transmit pulses sufficient to excite the transducer element T to ultrasound oscillation. The ON duration of a single transmit pulse can generally be selected to be between 50 ns and 500 ns, but is preferably about 150 ns; and the pulse height (i.e., amplitude) of the transmit pulses preferably is between 50 and 150 V.

Virtually any piezoelectric transducer element may be used in such an imaging system, although in the embodiment of FIG. 1 the transducer element T is preferably a piezoceramic element. Moreover, the transducer element T is preferably part of an ultrasound array (not shown) comprising a plurality of transducer elements. Such an array may be a linear array or a two-dimensional array, such as a matrix-type array. Arrays of this type are generally integrated in a substrate through microstructuring.

In an embodiment of the present invention using a transducer array, a duplexer may be associated with each transducer element of the array, with the duplexer preferably integrated with the array in the substrate. All transducer elements of the array are driven by a single transmitter, using a phase lag, to generate a directed ultrasound beam, which is preferably electronically directed at different parts of the object to be imaged. By contrast, in the embodiment with only a single transducer element T, the object to be imaged may be mechanically scanned by physically moving the transducer element T.

Looking now at the receive mode of the ultrasound imaging system, ultrasound signals are reflected back from the object to the transducer element T (or an array of transducer elements T) as an echo pulse. The transducer element T converts these echo pulses into electrical signals (i.e., echo signals) that are then fed by duplexer 2 to an input of the receiver 4. In the receiver 4, the input signals are preferably amplified and then fed to a signal processor (not shown) for evaluating the image information.

The duplexer 2 of the embodiment shown in FIG. 1 includes a receiver switch 20 for electrically connecting the transducer element T to the receiver 4 when the imaging system is operating in the receive mode. The receiver switch 20 is also used for electrically decoupling both the transducer element T and the transmitter 3 from the receiver 4 when the imaging system is operating in the transmit mode. The duplexer 2 further includes a transmitter switch 21 which, similar to the receiver switch 20, is used for electrically connecting the transducer element T to the transmitter 3 when the imaging system is operating in the transmit mode, and for electrically decoupling both the transducer element T and the receiver 4 from the transmitter 3 when the imaging system is in the receive mode. Both the receiver switch 20 and the transmitter switch 21 are electrically connected to the transducer element T through a common connection point 22.

In the embodiment of FIG. 1, the receiver switch 20 includes a variable capacitance diode 8 having two connections. Variable capacitance diodes are well known in the art, and therefore are not described in detail herein. The variable capacitance diode 8 is connected through its two connections between the receiver 4 and the transducer element T in the reverse direction for the transmit pulses emitted by the transmitter 3. In the embodiment shown, the variable capacitance diode 8 is driven in the reverse direction by positive transmit pulses. For negative transmit pulses, the polarity of the variable capacitance diode 8 would be exactly reversed. It is of course possible to connect additional circuit elements between the variable capacitance diode 8 and the receiver 4 to meet the specific requirements of any particular application.

The variable capacitance diode 8 exhibits a capacitance C that is many times greater (typically, 20 to 30 times) when both of its connections are at the same potential; that is, when the reverse voltage U applied to the variable capacitance diode 8 equals 0 V, as opposed to when a transmit pulse is applied to the variable capacitance diode 8 with a reverse voltage U of, for example, 120 V. This dependence of the capacitance C on the reverse voltage U being applied to the variable capacitance diode 8 may be advantageously exploited according to the present invention. To illustrate, when the imaging system is in the transmit mode, only negligible displacement currents can pass through the variable capacitance diode 8 because of its comparatively small capacitance C. On the other hand, when the system is in the receive mode, the variable capacitance diode 8 functions as a coupling capacitance due to its then much higher capacitance C, allowing the echo signals from the transducer element T to be through-coupled in a purely capacitive manner, with only minimal loss. As a result, virtually no additional noise is injected into the receiver 4. Furthermore, the variable capacitance diode 8 can operate in a purely passive manner, without the need for any externally-supplied control signals.

In addition to the above characteristics, at a reverse voltage U of 0 V, the impedance Z of the variable capacitance diode 8 may be selected to be relatively small, preferably significantly smaller than the input impedance of the receiver 4. In this way, the attenuation of the echo signals from the transducer element T is kept advantageously low. In an especially advantageous enhancement, applicable to the reverse voltage U applied when the imaging system is in the transmit mode, the impedance Z of the variable capacitance diode 8 may be set greater than the impedance of the transducer element T to reduce power losses that otherwise might occur.

In a two-dimensional array of transducer elements T, their impedance is generally composed of a parallel circuit arrangement of about 5 kΩ and about 2 pF. A suitable impedance Z of the variable capacitance diode 8 may then be obtained, for example, by selecting a variable capacitance diode 8 having a capacitance C of approximately 3.5 pF at a reverse voltage U of 120 V and approximately 40 pF at a reverse voltage U of 0 V, with a transmit pulse duration of approximately 150 ns.

Figure 2:
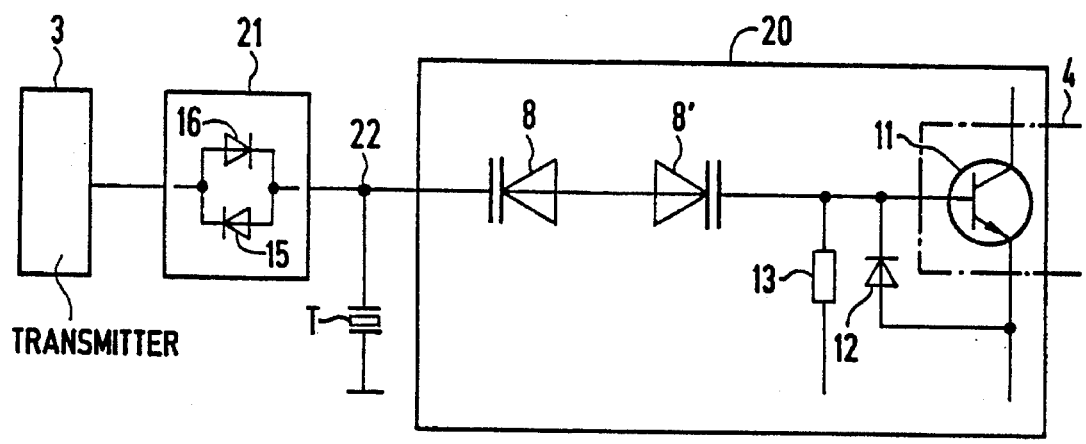
FIG. 2 is a schematic representation of an alternate embodiment of a duplexer according to the present invention.

FIG. 2 illustrates a preferred embodiment of a duplexer 2 in which the receiver switch 20 includes two variable capacitance diodes 8, 8' having opposite polarity connected in series between the transducer element T and the receiver 4. The first variable capacitance diode 8 is connected in the reverse direction with respect to positive transmit pulses, while the second variable capacitance diode 8' is connected in the reverse direction with respect to negative transmit pulses. This arrangement offers the advantage of effectively shielding the receiver 4 from bipolar transmit pulses having both positive and negative components.

In the embodiment shown in FIG. 2, the receiver 4 preferably employs a bipolar transistor 11 as a preamplifier. An additional diode 12 is associated with the transistor 11, arranged in a direction opposite that of a diode formed by the base and the emitter of the transistor 11, thereby protecting the transistor 11 from residual currents that may pass through the variable capacitance diodes 8, 8' during transmit mode due to their residual capacitance between the transducer element T and the receiver 4. When the ultrasound imaging system is in the receive mode, the diode 12 represents a largely negligible capacitive load because it is slightly biased in its reverse direction as a result of the specified wiring, reducing the capacitance of its depletion layer.

The receiver switch 20 of this embodiment further includes a resistor 13 for establishing the potential at the connections of the variable capacitance diodes 8, 8' and the base potential of the bipolar transistor 11. A protective circuit of this type (that is, having a diode associated with a preamplifier) may be provided in any of the embodiments discussed herein.

In another embodiment of the present invention, at least one additional bleeder resistor can be connected in parallel to one of said variable capacitance diodes 8, 8' providing a discharge path for charges accumulated during the transmit mode. Preferably, the value of this resistor is large compared to the receive mode impedance of the variable capacitance diode to which it is connected.

FIG. 2 also illustrates a preferred embodiment of the transmitter switch 21. The transmitter switch 21 comprises an inverse-parallel circuit of two diodes 15, 16 having opposite polarities, connected between the transmitter 3 and the transducer element T through the common connection 22. Alternatively, instead of one or both of these diodes 15, 16, a series circuit arrangement of at least two diodes may be employed, with the diodes again disposed in opposite directions in order to reduce the capacitive loading of the transducer element T.

In addition to the embodiment for the transmitter switch 21 described above, the transmitter switch 21 may comprise an active (i.e., controllable) integrated circuit including CMOS switches. Such integrated circuits are known in the art and are disclosed, for example, in Tietze and Schenk, *Semiconductor Circuit Engineering* 217 (9th ed., Springer-Verlag 1990). In principle, any of the specific embodiments described herein for the transmitter switch 21, as well as any other suitable embodiments for a transmitter switch 21, may be used in any of the described embodiments for a duplexer according to the present invention.

While the present invention has been described with reference to specific embodiments, persons skilled in the art will recognize that many modifications and variations are possible. Accordingly, the present invention embraces all alternatives, modifications and variations that fall within the spirit and scope of the appended claims, as well as all equivalents thereof.

What is claimed:

1. An ultrasound imaging system comprising:

at least one transducer element;

a transmitter for exciting the at least one transducer element with transmit pulses during a transmit mode of the imaging system;

a receiver for evaluating echo signals received by the at least one transducer element during a receive mode of the imaging system; and a duplexer provided for each of the at least one transducer element, said duplexer comprising:

a first switch adapted to electrically couple the at least one transducer element to the receiver when the imaging system is in the receive mode, and to electrically decouple both the at least one transducer element and the transmitter from the receiver when the imaging system is in the transmit mode, said first switch comprising at least one variable capacitance diode connected between the at least one transducer element and the receiver and driven in reverse direction by the transmit pulses emitted by the transmitter; and a second switch adapted to electrically couple the at least one transducer element to the transmitter when the imaging system is in the transmit mode, and to electrically decouple both the at least one transducer element and the receiver from the transmitter when the imaging system is in the receive mode, wherein said first and second switches are electrically coupled to one another at a common connection point.

2. The ultrasound imaging system of claim 1, wherein said first switch further comprises:

a bipolar transistor having a base and an emitter, with said base being electrically coupled to said variable capacitance diode; and a second diode connected to a diode formed by said base and said emitter, with said second diode disposed in a direction opposite that of said diode.

3. The ultrasound imaging system of claim 2, wherein said bipolar transistor is included in a preamplifier of the receiver.

4. The ultrasound imaging system of claim 2, wherein said first switch comprises two variable capacitance diodes connected in series and having opposite polarities.

5. The ultrasound imaging system of claim 4, wherein when no transmit pulse is being applied by the transmitter, each of said two variable capacitance diodes exhibits an impedance that is smaller than the input impedance of the receiver.

6. The ultrasound imaging system of claim 5, wherein when a transmit pulse is being applied by the transmitter, at least one of said two variable capacitance diodes exhibits an impedance that is greater than the impedance of the transducer element.

7. The ultrasound imaging system of claim 3, wherein said first switch comprises two variable capacitance diodes connected in series and having opposite polarities.

8. The ultrasound imaging system of claim 7, wherein when no transmit pulse is being applied by the transmitter, each of said two variable capacitance diodes exhibits an impedance that is smaller than the input impedance of the receiver.

9. The ultrasound imaging system of claim 4, wherein when a transmit pulse is being applied by the transmitter, at least one of said two variable capacitance diodes exhibits an impedance that is greater than the impedance of the transducer element.

10. The ultrasound imaging system of claim 1, wherein the at least one transducer element is arranged in an array.

11. The ultrasound imaging system of claim 1, wherein when not transmit pulse is being applied by the transmitter, each of said variable capacitance diodes exhibits an impedance that is smaller than the input impedance of the receiver.

12. The ultrasound imaging system of claim 11, wherein when a transmit pulse is being applied by the transmitter, at least one of said variable capacitance diodes exhibits an impedance that is greater than the impedance of the transducer element.

* * * * *